United States Patent [19]

Reindel

[11] 4,406,020
[45] Sep. 20, 1983

[54] MILLIMETER WAVE PRINTED CIRCUIT MIXER

[75] Inventor: John Reindel, San Diego, Calif.

[73] Assignee: The United States of America represented by the Secretary of the Navy, Washington, D.C.

[21] Appl. No.: 288,229

[22] Filed: Jul. 29, 1981

[51] Int. Cl.³ .............................................. H04B 1/26
[52] U.S. Cl. .................................. 455/327; 455/328; 455/330
[58] Field of Search .............................. 455/325–328, 455/330–332; 330/4.9

[56] References Cited

U.S. PATENT DOCUMENTS

| | | | |
|---|---|---|---|
| 3,376,507 | 4/1968 | McEuen et al. | 343/5 PD |
| 3,638,126 | 1/1972 | Spacek | 455/328 |
| 3,735,267 | 5/1973 | Napoli | 455/327 |
| 3,854,083 | 12/1974 | Hulderman et al. | 455/328 |
| 3,939,430 | 2/1976 | Dickens et al. | 455/327 |
| 3,986,153 | 10/1976 | Kuno et al. | 333/239 |
| 4,006,425 | 2/1977 | Chang et al. | 329/160 |
| 4,032,849 | 6/1977 | Gysel et al. | 455/327 |
| 4,232,401 | 11/1980 | Chang et al. | 455/328 |

Primary Examiner—Marc E. Bookbinder
Attorney, Agent, or Firm—Robert F. Beers; Ervin F. Johnston; Harvey Fendelman

[57] ABSTRACT

A millimeter wave printed circuit mixer is disclosed which has extended RF and IF bandwidths. A dual ridge waveguide to slotline transition is utilized to bring the RF signal into the device. The waveguide to slotline transition is terminated in first and second shorted RF slotlines formed on the bottom of a dielectric substrate and extending from the RF slotline. A microstrip LO bandpass filter terminating in a microstrip line is formed on the dielectric substrate and is utilized to bring the local oscillator signal to the device. First and second beam lead diodes are connected from the microstrip line through apertures in the dielectric substrate and thence are connected across the dual shorted RF slotlines and connected to the ground plane conductor on the underside of the dielectric substrate. An IF filter is formed on the dielectric substrate and connected to the microstrip line for removing the IF signal from the device. The dielectric substrate and the elements formed on the substrate are enclosed within a waveguide housing.

11 Claims, 4 Drawing Figures

MILLIMETER WAVE PRINTED CIRCUIT MIXER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of frequency converters and more particularly to high frequency converters employing semiconductor diodes. Such frequency converters are usually employed in superheterodyne microwave receivers for which the signal frequency is so high that amplification at the signal frequency is technically or economically not feasible. The frequency converter changes the signal frequency to an intermediate frequency which carries the same information as the signal but is at a much lower frequency at which amplification is technically and economically feasible.

Waveguide balanced mixers as described above have been in use for more than thirty years. These mixers generally are implemented such that the radio frequency (RF) signal to be down converted is mixed with a local oscillator (LO) signal by means of semiconductor beam lead diodes. Typically these circuits include a 180° hybrid junction formed by joining two transmission lines so as to provide good isolation between the LO and the RF ports. A balanced waveguide mixer has been disclosed in the International Edition of *Microwave Journal*, Aug. 19, 1979, Volume 22, Number 8, pages 66–68, by Paul J. Meier in which printed circuit techniques are utilized in conjunction with a metal waveguide housing that is used for support and isolation. In that device the circuit is printed on a dielectric substrate and embedded inside the waveguide in the E-plane. More particularly, this prior art mixer has a double ridge waveguide to slotline transition to transform the RF signal from the $TE_{10}$ waveguide mode to the E-field slotline mode and it uses an LO waveguide to microstrip transition which terminates in a coplanar transmission line. In this prior art device the beam-lead diodes are mounted in a quarter-wave section of the coplanar line which is excited in the balanced mode from the RF port and the unbalanced mode from the microstrip LO port. The IF is returned to ground by high impedance wires bounded to the rear surface metalization via holes drilled through the board. The IF is extracted from the diode mount through a high impedance microstrip line which serves as the LO matching transformer. This prior art mixer contains a diplexer to separate the LO and IF signals. The junction between the transmission lines and the LO-IF diplexer design determines the useable bandwidth of the mixer. In particular it is important that the balanced RF slotline and the unbalanced LO transmission line be properly terminated at the diode junction. In this prior art mixer disclosed by Meier and in many other mixer designs the LO line is converted to a coplanar line and the RF slotline is divided and continued into the two coplanar slots. Thus, for some length, the RF and LO signals coexist on the same transmission line. The length of the coplanar line may also limit the IF bandwidth separating the LO-IF junction from the LO-RF junction. In general, the previously used mixer designs have limitations in operating RF and IF bandwidth caused by the poor termination of the transmission lines and by not having the LO-IF diplexer as an integral part of the LO-RF junction.

SUMMARY OF THE INVENTION

The present invention extends the operating RF and IF bandwidth of a mixer so that a single mixer can operate over the entire 3% to 40% bandwidth that normally is assigned a waveguide band, such as the K band (18 to 26.5 GHz) and the Ka-band (26.5 to 40 GHz). In addition, the IF bandwidth is equal to or greater than the RF bandwidth. For example, a Ka-band mixer can have up to 18 GHz IF bandwidth. This feature is a direct result of the new design of the present invention, i.e. the junction between the LO microstrip line and the RF slotline is more direct and abrupt. The present invention has no transmission line common to both the LO and RF signals and the IF-LO diplexer can be located immediately adjacent the diode junction, i.e. within a fraction of wavelength. The extended RF and IF bandwidth of the present invention is very important for surveillance and radar warning systems. Typically, down converting the ka-band previously required an RF multiplexer filter, four mixers, four local oscillators, and four intermediate frequency filters and amplifiers per band. The mixer of the present invention alone can now down convert the entire band to a broader intermediate frequency with a single local oscillator and with the use of two intermediate frequency filters and amplifiers. Hence the receiving system can be reduced to only one fourth the usual complexity by utilization of the present invention.

OBJECTS OF THE INVENTION

Accordingly, the primary object of the present invention is to disclose a novel mixer that has extended RF and IF bandwidths.

It is a further object of the present invention to disclose a novel mixer in which the IF-LO diplexer is located immediately adjacent to the diode junction.

It is a still further object of the present invention to disclose a novel mixer that reduces the number of local oscillators, intermediate frequency filters and amplifiers required for incorporation of the mixer into a receiving system.

Other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1b is a blow-up of the circled portion of the printed circuit card illustrated in FIG. 1a.

DESCRIPTION OF THE PREFERRED EMBODIMENT

Figure 1B:
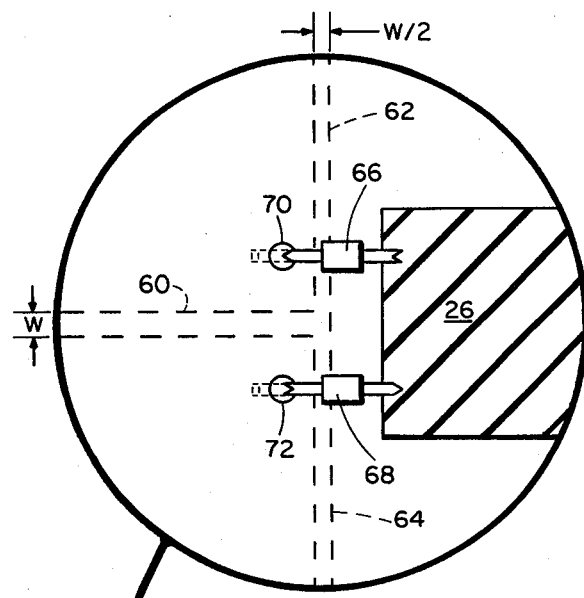
Figure 1A:
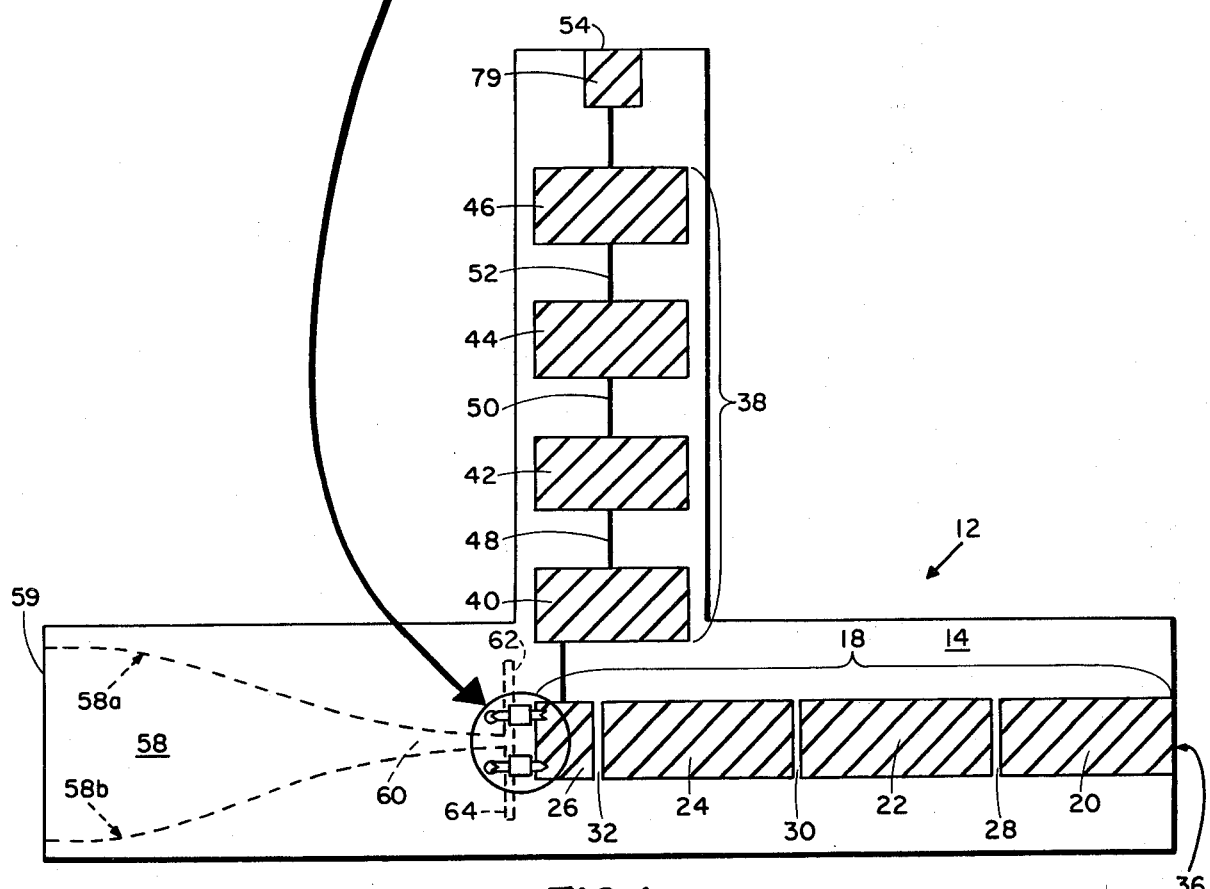
FIG. 1a is a top view of the printed circuit card of the present invention.
Figure 3:
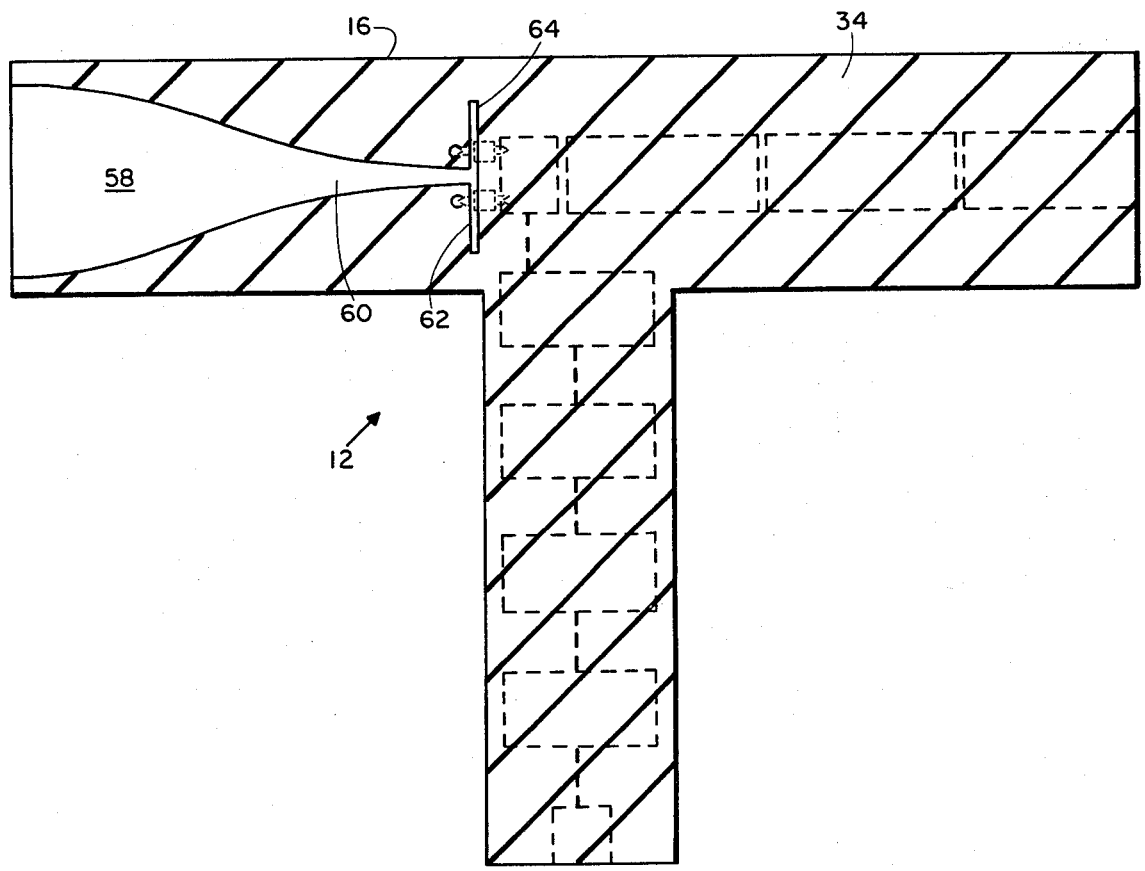
FIG. 3 is a bottom view of the printed circuit card of the present invention.

Referring to now to FIGS. 1a, 1b and 3 the printed circuit card 12 of the present invention will now be described. The mixer of the present invention is formed on a dielectric circuit card 12 which preferably is made of "Duroid". The dielectric substrate 12 has a top surface 14 and a bottom surface 16 as seen in FIG. 3. A local oscillator bandpass filter 18 is formed on the top surface 14 of the dielectric circuit card 12. The local oscillator bandpass filter 18 is comprised of metallic sections 20, 22, 24 and 26 separated, respectively, by slots 28, 30, and 32. The underside of the circuit card 12 has a metallized surface 34 with which the elements of the local oscillator bandpass filter 18 cooperate to form a microstrip transmission medium. It is to be understood that although the local oscillator narrow bandpass filter 18 is illustrated and described as a capacitive coupled type filter, other types of filters may be utilized so long as they serve to pass the local oscillator signal and to reject intermediate frequency signals. The local oscillator signal is injected into the device via port 36.

Figure 2:
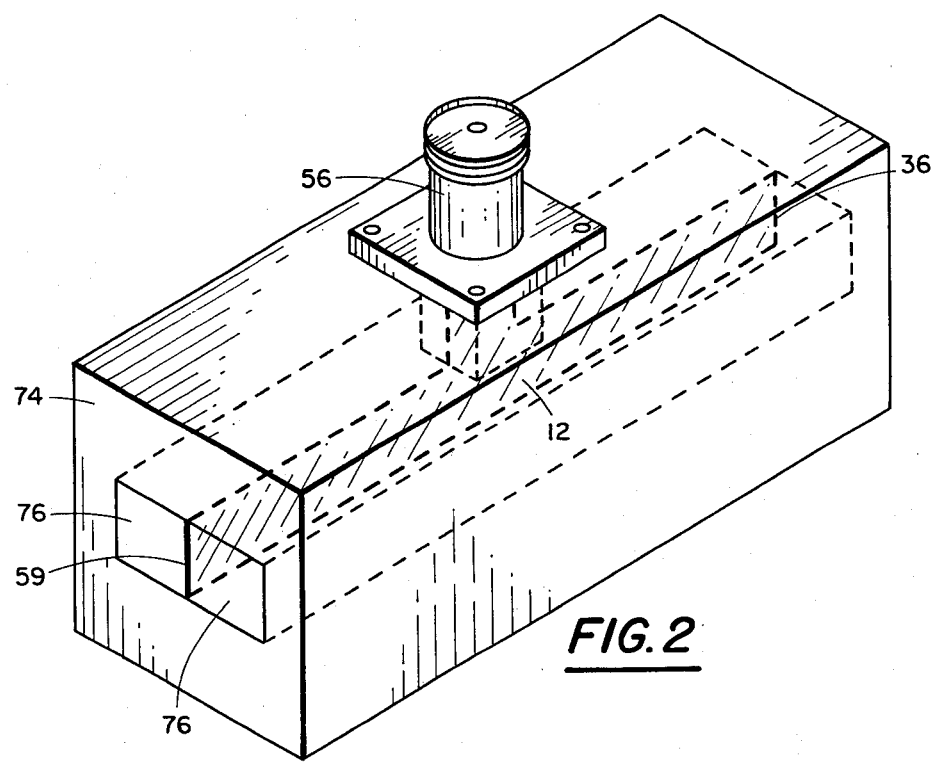
FIG. 2 is a perspective view of the printed circuit card of the present invention mounted within a waveguide housing in accordance with the present invention.

Also formed on the top surface 14 of the dielectric circuit card 12 is an IF low pass filter 38 comprised of metallic sections 40, 42, 44 and 46 connected, respectively by metallic conductors 48, 50 and 52. It is also to be understood that the specific type of filter 38 utilized may be other than that illustrated and described above so long as the filter 38 blocks local oscillator frequency signals and passes intermediate frequency signals. The intermediate frequency signal is extracted from the device via output port 54 and as is illustrated in FIG. 2 may be drawn off by means of a standard SMA connector 56 as would be readily understood by those of ordinary skill in this art.

Referring to FIGS. 1a, 1b and 3 it is seen that the underside 16 of the circuit card 12 is metallized with a layer of metal 34 which preferably is copper as are the metallized regions on the top surface 14 of the circuit card. In accordance with the present invention a portion of the metallized layer 34 on the underside 16 of the circuit card 12 is removed to form a radio frequency waveguide to slotline transition 58. The waveguide to slotline transition 58 has a double ridge waveguide transition 58a and 58b which leads to slotline section 60. Slotline 60 is terminated in shorted RF slotlines 62 and 64 each of which extends from their juncture with slotline 60 for a distance of λ/4 where λ is the wavelength at the midband of the RF signal entering the device via port 59. It is noted that although the shorted slots 62 and 64 are illustrated as colinear and perpendicular to the slotline 60 this particular arrangement is not critical, the important consideration being that the length of each of the shorted slots 62 and 64 is λ/4. For best operating results it has been determined that the width w of the slotline 60 should be twice the width of the shorted slotlines 62 and 64. It is also to be understood that the shorted slotlines 62 and 64 may be curvilinear as well as straight and may extend at virtually any angle from their juncture with slotline 60.

First and second mixer diodes 66 and 68 are connected in opposite phase with respect to each other to the microstrip line 26 at one end and pass through apertures 70 and 72 formed in the dielectric circuit card 12. On the under surface side 16 of the dielectric card, the beam-lead diodes 66 and 68 are connected to the ground plane conductor. The beam-lead diodes preferably are GaAs Schottky-barrier mixer diodes. They are connected from the end of the local oscillator microstrip line across the dual slotline stubs 62 and 64. Referring to FIG. 2 it is seen that the circuit card 12 is placed inside a waveguide housing 74 which may be formed as a split-block waveguide assembly as is illustrated. The circuit card 12 is situated such that the plane of the circuit card 12 is perpendicular to the broad walls 76 of the waveguide housing 74. It is to be understood that the details of the circuit card 12 have been omitted from the illustration of FIG. 2 for purposes of clarity of illustration.

It is thus seen that the novel mixer of the present invention has the RF slotline 60 divided into two quarter wave shorted slots 62 and 64 and that the local oscillator unbalanced microstrip line is terminated at the division of the slotline 60 on the opposite side of the dielectric circuit card 12. It is also seen that the narrow bandpass local oscillator filter 18 is located such that the line 26 from the RF junction to the first local oscillator filter slot 32 has a length that is only about one-tenth of the local oscillator signal wavelength. It should also be readily apparent that the IF low pass filter 38 is connected to the local oscillator transmission line with a high impedance microcircuit line that presents an open circuit at the local oscillator frequency.

The mixer of the present invention operates in substantially a conventional manner with the local oscillator signal being injected at input port 36 and the RF signal being injected at input port 59. The signals are "mixed" at the juncture of the slotline 60, the shorted stubs 62 and 64 and the mixer diodes 66 and 68 such that an IR output is derived at output 54 of the device.

Obviously, many other modifications and variations of the present invention are possible in the light of the above teachings. It is therefore to be understood that within the scope of the appended claims the invention may be practiced otherwise than as specifically described.

What is claimed is:
1. A balanced printed circuit mixer comprising:
a dielectric substrate having a top side and a bottom side;
an RF slotline having an input end and an output end situated on said dielectric substrate bottom side for receiving and propagating an RF signal to be converted to an IF signal;
first and second shorted RF slotlines situated on said dielectric substrate bottom side and extending from said RF slotline output end;
a ground plane conductor situated on said dielectric substrate bottom side;
a section of microstrip line situated on said dielectric substrate top side for propagating a local oscillator signal;
a first diode connected to said section of microstrip line, overlaying said first shorted RF slotline and connected to said ground plane conductor;
a second diode connected to said section of microstrip line, overlaying said second shorted RF slotline and connected to said ground plane conductor;
an IF filter situated on said dielectric substrate and connected to said section of microstrip line for passing signals having IR frequencies and for rejecting signals having local oscillator frequencies; and
a bandpass filter situated on said dielectric substrate and connected to said section of microstrip line for receiving and propagating a local oscillator signal and for rejecting IF signals.
2. The mixer of claim 1 wherein said first and second shorted slotlines extend for a distance of λ/4 from said RF slotline output end where λ is the wavelength at the midband of said RF signal.

3. The mixer of claims 1 or 2 wherein said RF slotline output end has a width $\omega$ and the width of said first and second shorted RF slotlines is approximately $\omega/2$.

4. The waveguide of claim 3 wherein said first and second diodes are beam lead diodes.

5. The mixer of claim 4 wherein said first and second diodes are connected to first and second electrical leads, respectively, said first and second electrical leads being connected to said ground plane through first and second apertures in said dielectric substrate.

6. The mixer of claims 1 or 2 further comprising:
a waveguide housing enclosing said dielectric substrate.

7. The mixer of claim 6 wherein:
the broadwalls of said waveguide housing are perpendicular to the plane of said dielectric substrate.

8. The mixer of claim 3 further comprising:
a waveguide housing enclosing said dielectric substrate.

9. The mixer of claim 8 wherein:
the broadwalls of said waveguide housing are perpendicular to the plane of said dielectric substrate.

10. In a millimeter wave balanced mixer having a printed circuit card situated within a waveguide housing, and having a waveguide to slotline transition on said circuit card for receiving an RF signal, a section of slotline on said circuit card coupled to said slotline transition for propagating said RF signal, a microstrip filter on said printed circuit card for receiving an LO signal, an IF output port on said circuit card, first and second mixer diodes connected to said circuit card adjacent said section of slotline said diodes further operably coupled to said microstrip filter for providing an IF signal to said IF output port in response to said RF and LO signals, the improvement comprising:
first and second slotline stubs extending from said section of slotline, each respective slotline stub being shorted at respective ends thereof; and
said first mixer diode extending over said first slotline stub and said second mixer diode extending over said second slotline stub.

11. The improvement of claim 10 wherein:
said first and second slotline stubs are $\lambda/4$ long where $\lambda$ is the wavelength at the midband of said RF signal.

* * * * *